(12) United States Patent
Kim et al.

(10) Patent No.: US 8,786,076 B2
(45) Date of Patent: Jul. 22, 2014

(54) SEMICONDUCTOR DEVICE AND METHOD OF FORMING A THERMALLY REINFORCED SEMICONDUCTOR DIE

(75) Inventors: OhHan Kim, Kyunggi-Do (KR);
YongHee Kang, Kyoungki-do (KR);
KyungHoon Lee, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 207 days.

(21) Appl. No.: 13/052,588

(22) Filed: Mar. 21, 2011

(65) Prior Publication Data
US 2012/0241941 A1    Sep. 27, 2012

(51) Int. Cl.
*H01L 23/34* (2006.01)
*H01L 23/367* (2006.01)

(52) U.S. Cl.
CPC ..... *H01L 23/367* (2013.01); *H01L 2224/73204* (2013.01); *H01L 2224/16225* (2013.01); *H01L 2224/73265* (2013.01); *H01L 2924/01322* (2013.01); *H01L 2224/48091* (2013.01); *H01L 2224/83385* (2013.01); *H01L 2924/19105* (2013.01); *H01L 2924/13091* (2013.01); *H01L 2224/32225* (2013.01); *H01L 2924/15311* (2013.01); *H01L 2224/32245* (2013.01)
USPC .......................................... 257/707; 257/706

(58) Field of Classification Search
USPC ................. 257/706, 707, 712, 713, 720, 722
See application file for complete search history.

(56) References Cited

U.S. PATENT DOCUMENTS

| | | | | |
|---|---|---|---|---|
| 5,276,586 A | * | 1/1994 | Hatsuda et al. | 361/705 |
| 5,825,087 A | * | 10/1998 | Iruvanti et al. | 257/707 |
| 6,181,015 B1 | * | 1/2001 | Gotoh et al. | 257/778 |
| 6,225,695 B1 | * | 5/2001 | Chia et al. | 257/712 |
| 6,607,942 B1 | * | 8/2003 | Tsao et al. | 438/122 |
| 6,906,413 B2 | * | 6/2005 | Bish et al. | 257/706 |
| 7,064,452 B2 | * | 6/2006 | Huang et al. | 257/787 |
| 7,215,020 B2 | * | 5/2007 | Nakase et al. | 257/706 |
| 7,361,972 B2 | * | 4/2008 | Chen | 257/622 |
| 7,755,184 B2 | * | 7/2010 | Macris et al. | 257/706 |
| 7,863,731 B2 | * | 1/2011 | Chen et al. | 257/706 |

* cited by examiner

*Primary Examiner* — S. V. Clark
(74) *Attorney, Agent, or Firm* — Robert D. Atkins; Atkins & Associates, P.C.

(57) ABSTRACT

A semiconductor device includes a substrate with conductive traces. A semiconductor die is mounted with an active surface oriented toward the substrate. An underfill material is deposited between the semiconductor die and substrate. A recess is formed in an interior portion of the semiconductor die that extends from a back surface of the semiconductor die opposite the active surface partially through the semiconductor die such that a peripheral portion of the back surface of the semiconductor die is offset with respect to a depth of the recess. A thermal interface material (TIM) is deposited over the semiconductor die and into the recess such that the TIM in the recess is laterally supported by the peripheral portion of the semiconductor die to reduce flow of the TIM away from the semiconductor die. A heat spreader including protrusions is mounted over the semiconductor die and contacts the TIM.

19 Claims, 14 Drawing Sheets

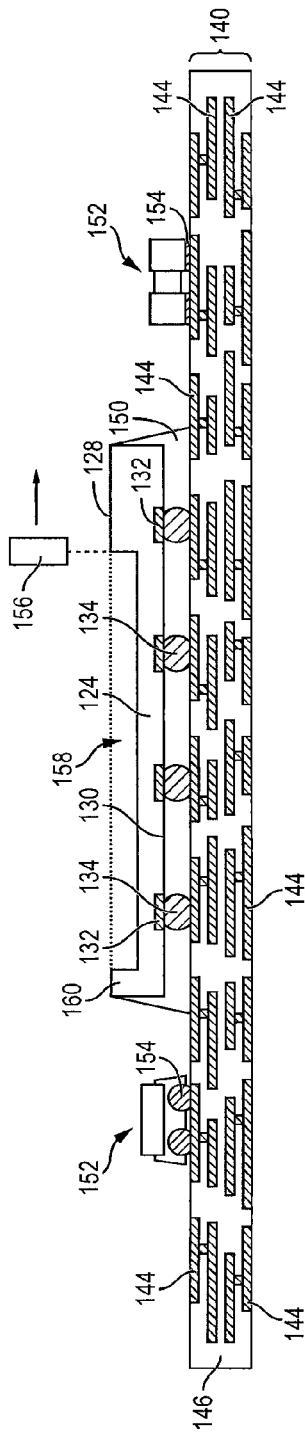
FIG. 4d
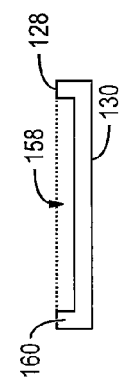
FIG. 4i
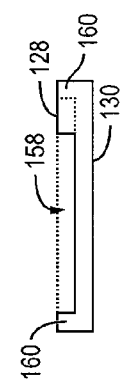
FIG. 4j
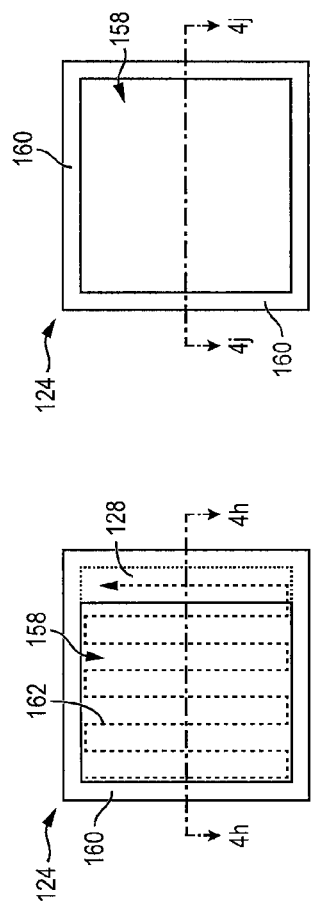
FIG. 4g
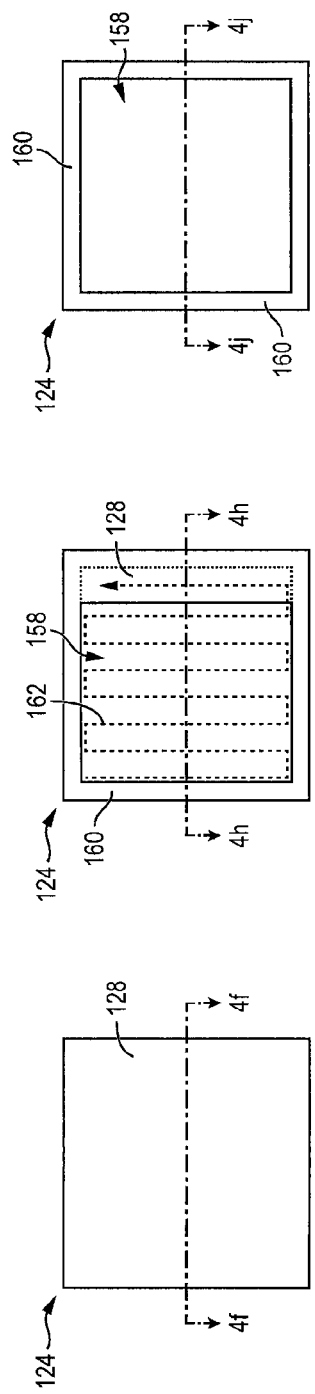
FIG. 4h
FIG. 4e
FIG. 4f

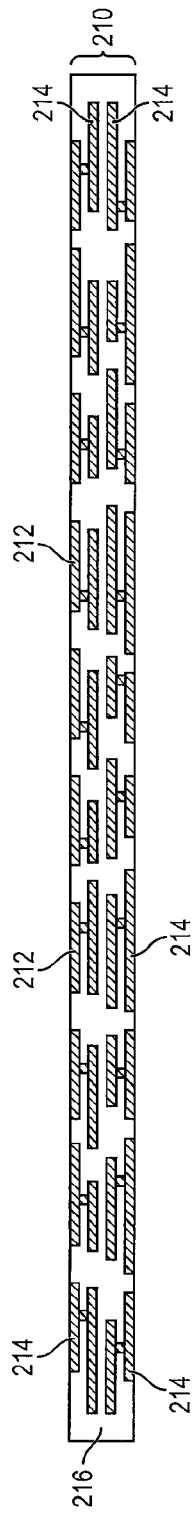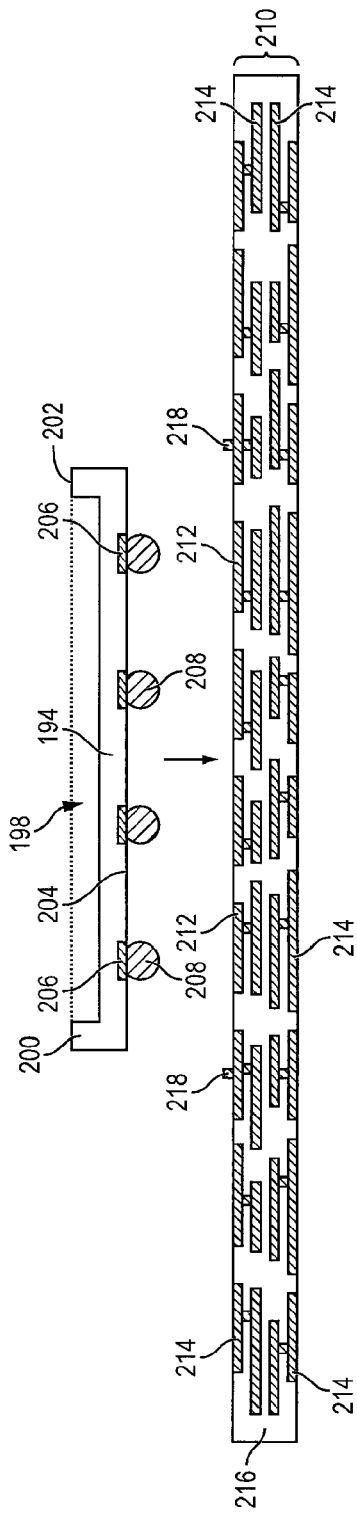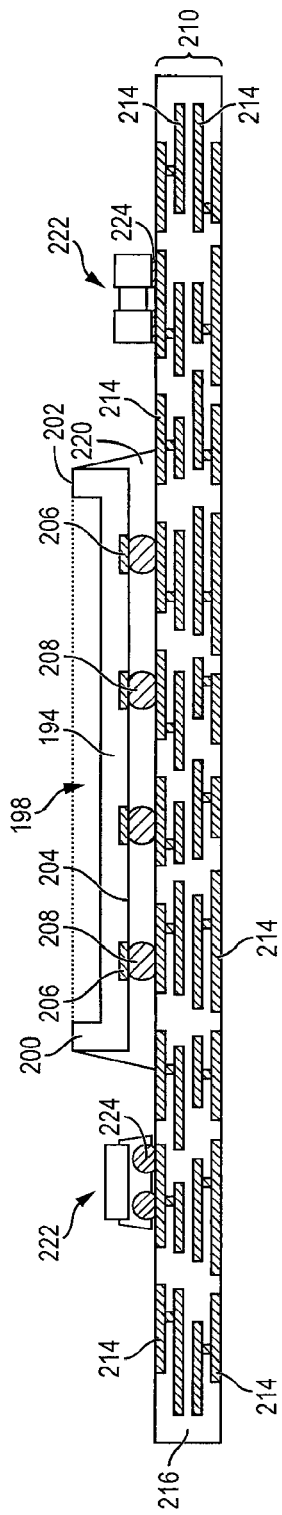

US 8,786,076 B2

SEMICONDUCTOR DEVICE AND METHOD OF FORMING A THERMALLY REINFORCED SEMICONDUCTOR DIE

FIELD OF THE INVENTION

The present invention relates in general to semiconductor devices and, more particularly, to a semiconductor device and method of forming a thermally reinforced semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

Most if not all semiconductor devices experience thermo-mechanical stresses under cyclic loading due to power on/off cycling. Under cyclic loading, thermo-mechanical stresses are exerted at an interface of a thermal interface material (TIM) and a die contact area between a back surface of a die and a surface of a heat spreader. The thermo-mechanical stresses exerted at the interface due to the relative motion or flexure between the semiconductor die and the heat-sink lead to a loss of TIM at the interface. The loss of TIM including lateral movement of the TIM away from the interface of the back surface of the semiconductor die and a surface of a heat spreader due to cyclical loading is referred to as pump out. With frequent cyclical loading leading to extensive thermo-mechanical stresses, pump out can lead to significant losses of TIM at the interface. Reduced quantities of TIM at the interface reduce thermal performance of the semiconductor die and in some instances can even lead to semiconductor die failure.

SUMMARY OF THE INVENTION

A need exists for a simple and cost effective thermally reinforced semiconductor device less susceptible to TIM pump out. Accordingly, in one embodiment, the present invention is a method of making a semiconductor device comprising the steps of providing a substrate with conductive traces, mounting a semiconductor die with an active surface oriented toward the substrate, depositing an underfill material between the semiconductor die and substrate, and forming a recess in an interior portion of the semiconductor die that extends from a back surface of the semiconductor die opposite the active surface partially through the semiconductor die such that a peripheral portion of the back surface of the semiconductor die is offset with respect to a depth of the recess. The method further includes the steps of depositing a TIM over the semiconductor die and into the recess such that the TIM in the recess is laterally supported by the peripheral portion of the semiconductor die to reduce flow of the TIM away from the semiconductor die, and mounting a heat spreader over the semiconductor die and connected to the conductive traces. The heat spreader includes protrusions that surround a perimeter of the TIM to reduce flow of the TIM away from the semiconductor die.

In another embodiment, the present invention is a method of making a semiconductor device comprising the steps of providing a substrate, mounting a semiconductor die with an active surface oriented toward the substrate, depositing underfill material between the semiconductor die and substrate, and forming a recess in the interior portion of the semiconductor die extending from a back surface of the semiconductor die opposite the active surface partially through the semiconductor die such that a peripheral portion of the back surface of the semiconductor die is offset with respect to a depth of the recess. The method further includes the steps of depositing a TIM over the semiconductor die and into the recess such that the TIM in the recess is surrounded by the peripheral portion of the semiconductor die to reduce flow of the TIM away from the semiconductor die, and mounting a heat spreader over the semiconductor die, contacting the TIM, and connected to the substrate.

In another embodiment, the present invention is a method of making a semiconductor device comprising the steps of providing a substrate, mounting a semiconductor die with an active surface oriented toward the substrate, depositing a TIM over a back surface of the semiconductor die opposite the active surface of the semiconductor die, mounting a heat spreader over the semiconductor die, contacting the TIM, and connected to the substrate, and providing a lateral support surrounding a periphery of the TIM to reduce flow of the TIM away from the semiconductor die.

In another embodiment, the present invention is a semiconductor device comprising a substrate. A semiconductor die is mounted to the substrate with an active surface of the semiconductor die oriented toward the substrate. A TIM is deposited over a backside of the semiconductor die opposite the active surface. A heat spreader is mounted over the semiconductor die, contacts the TIM, and connects to the substrate. A lateral support surrounds a periphery of the TIM to reduce flow of the TIM away from the semiconductor die.

BRIEF DESCRIPTION OF THE DRAWINGS

FIGS. 6a-6d illustrate another process of forming a thermally reinforced semiconductor device;

DETAILED DESCRIPTION OF THE DRAWINGS

Figure 1:
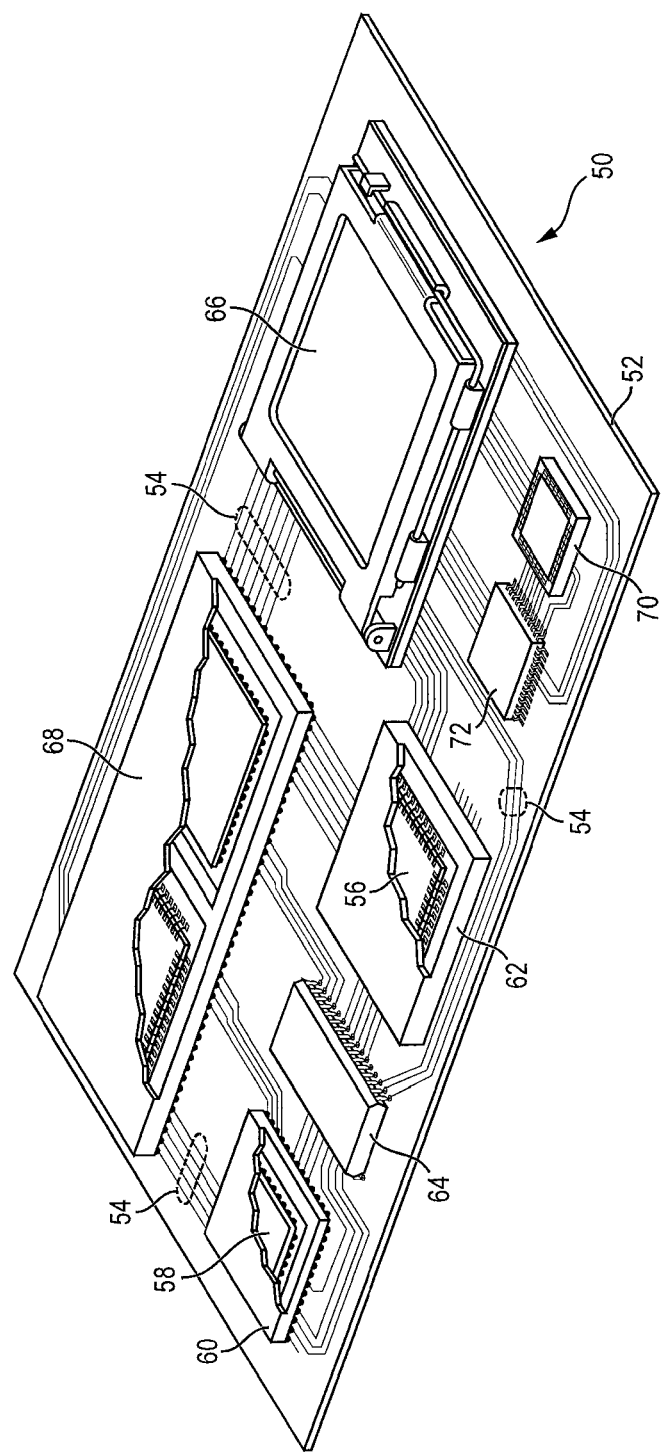
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Signal traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
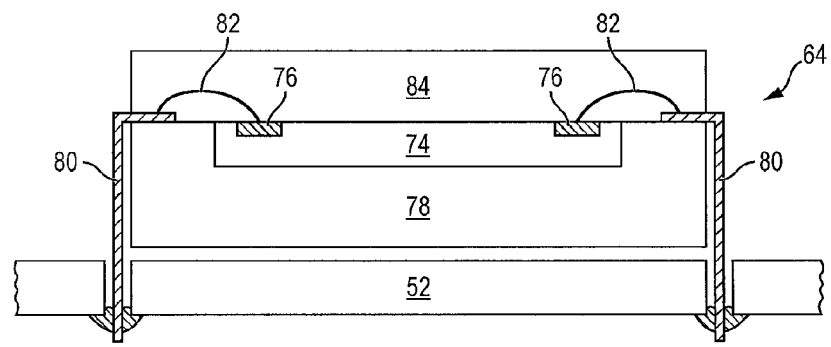
FIGS. 2a-2c illustrate further detail of the representative semiconductor packages mounted to the PCB.
Figure 2B:
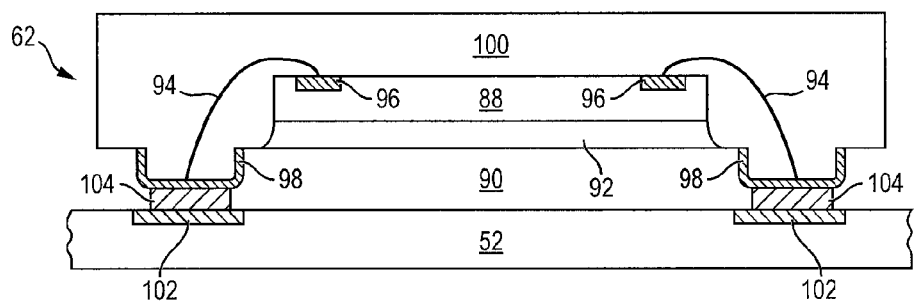
Figure 2C:
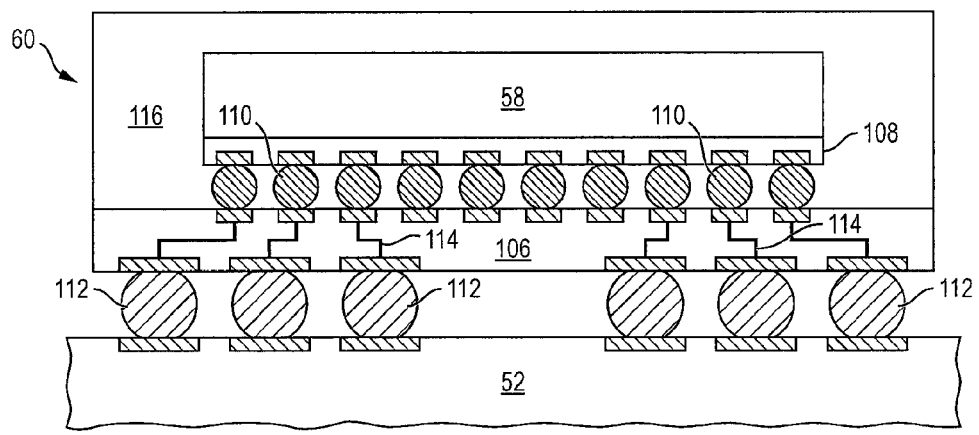

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
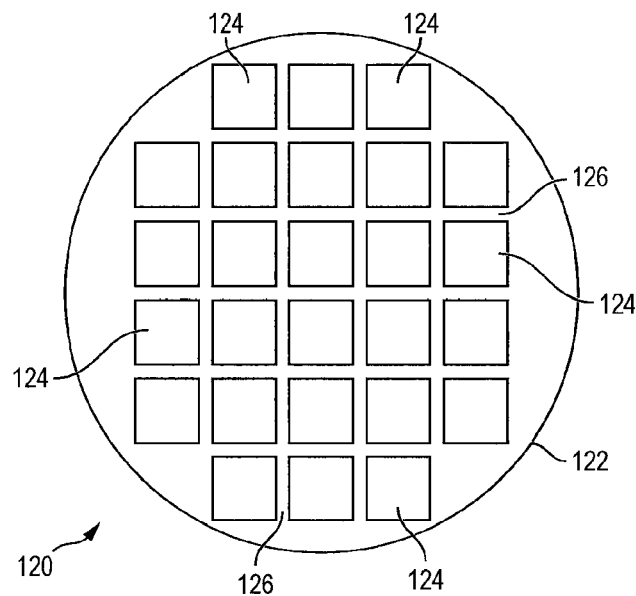
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on semiconductor wafer 120 separated by saw streets 126 as described above.

Figure 3B:
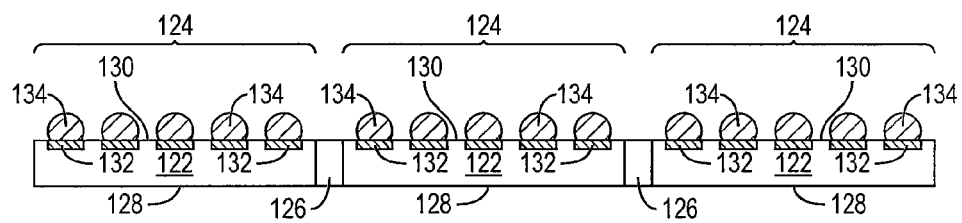

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

An electrically conductive bump material is deposited over conductive layer 132 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form spherical balls or bumps 134. In some applications, bumps 134 are reflowed a second time to improve electrical contact to conductive layer 132. In one embodiment, bumps 134 are formed over an under bump metallization (UBM) having a wetting layer, barrier layer, and adhesive layer. The bumps can also be compression bonded to conductive layer 132. Bumps 134 represent one type of interconnect structure that can be formed over conductive layer 132. The interconnect structure can also use bond wires, conductive paste, stud bump, micro bump, or other electrical interconnect. In one embodiment, semiconductor die 124 is a flipchip type semiconductor die.

Figure 3C:
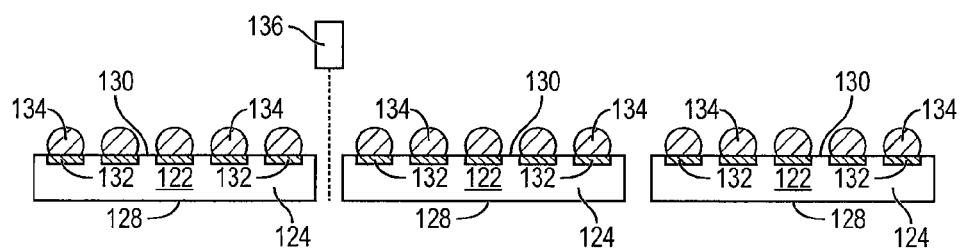

In FIG. 3c, semiconductor wafer 120 is singulated through saw street 126 using saw blade or laser cutting tool 136 into individual semiconductor die 124. Each semiconductor die 124 has bumps 134 formed over contact pads 132.

Figure 4A:
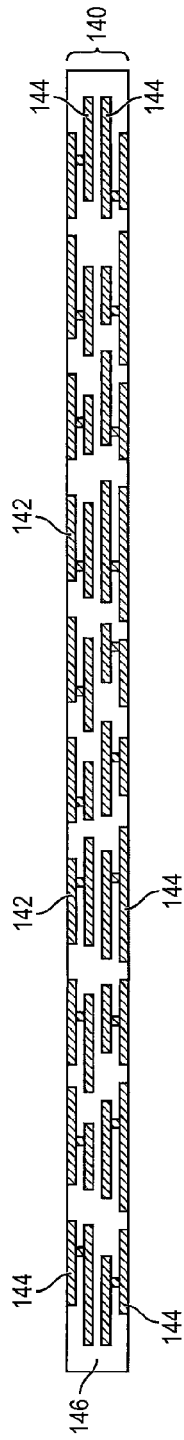
FIGS. 4a-4x illustrate a process of forming a thermally reinforced semiconductor device.
Figure 4B:
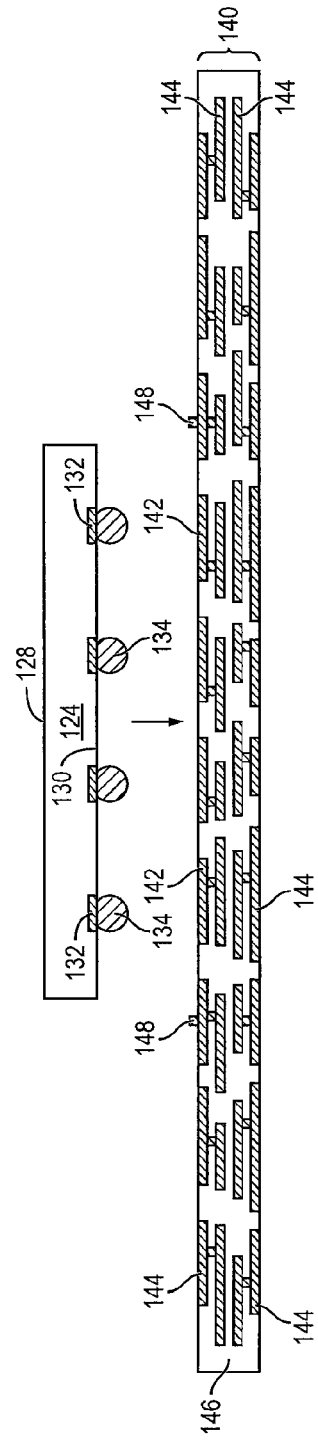
Figure 4C:
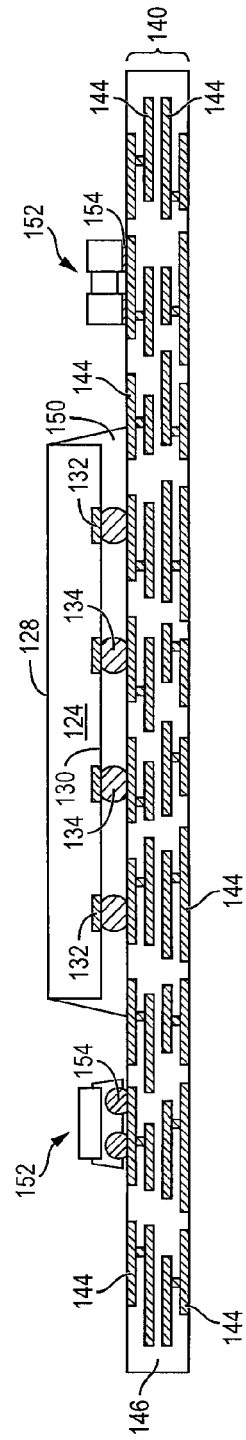
Figure 4K:
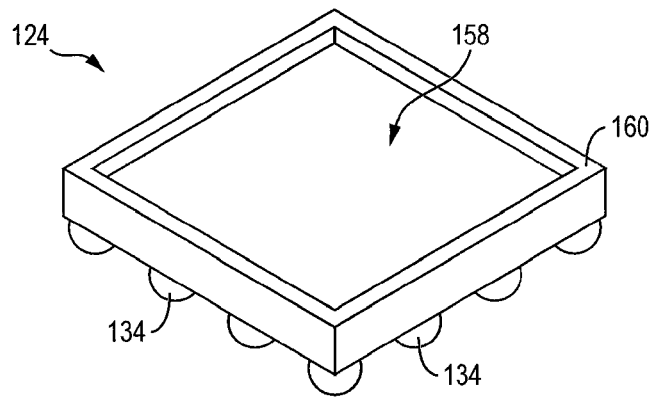
Figure 4L:
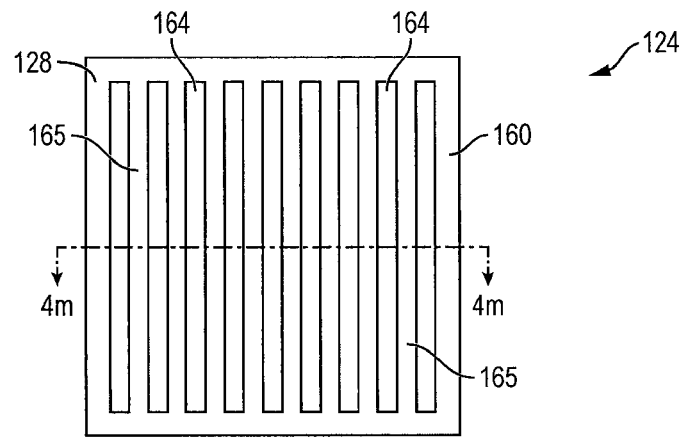
Figure 4M:
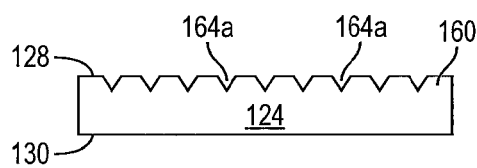
Figure 4N:
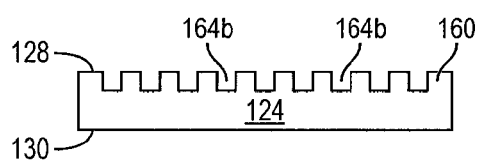
Figure 4O:
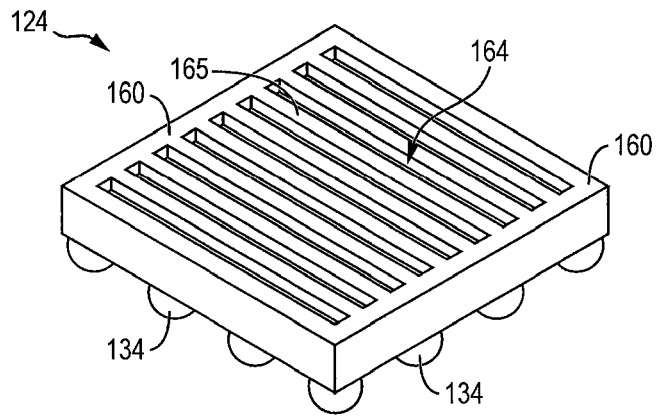
Figure 4P:
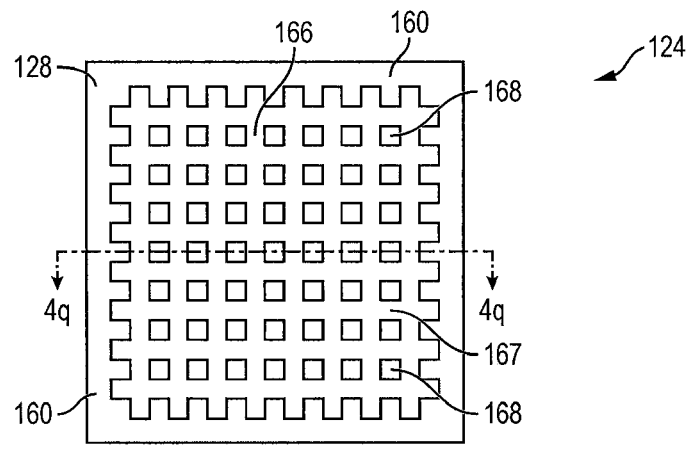
Figure 4Q:
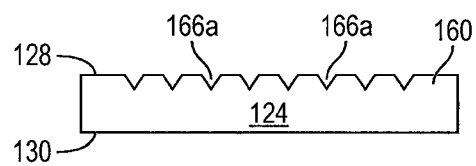
Figure 4R:
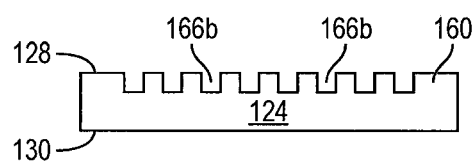
Figure 4S:
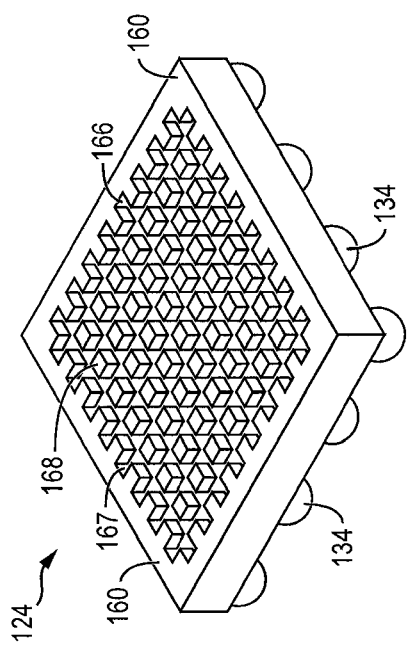
Figure 4T:
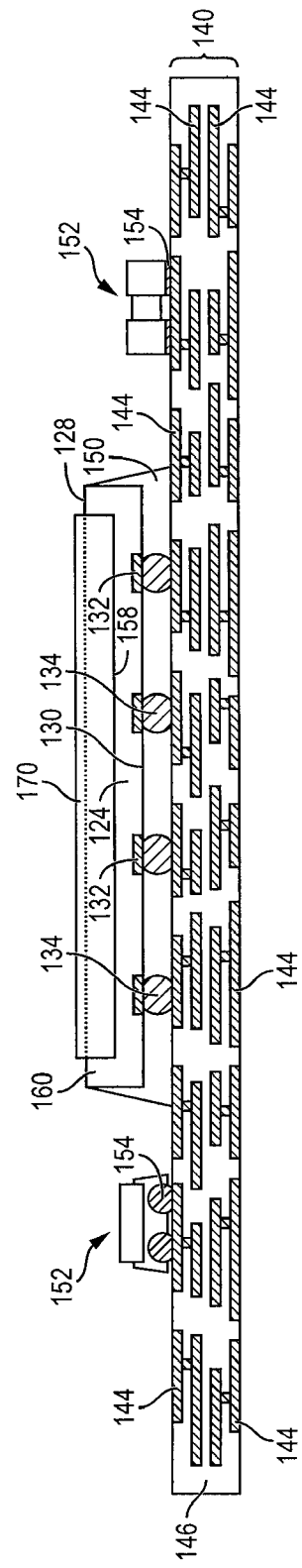
Figure 4U:
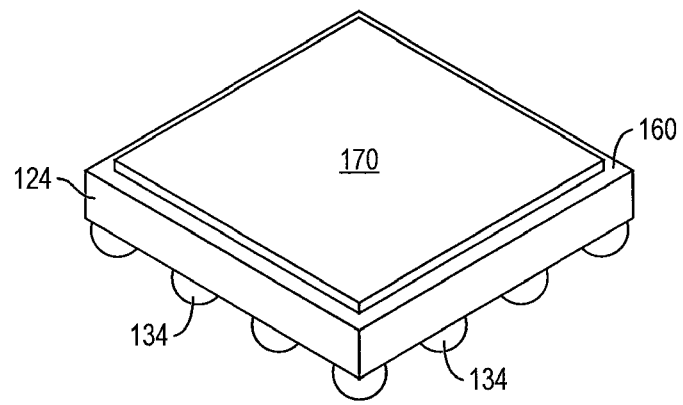
Figure 4V:
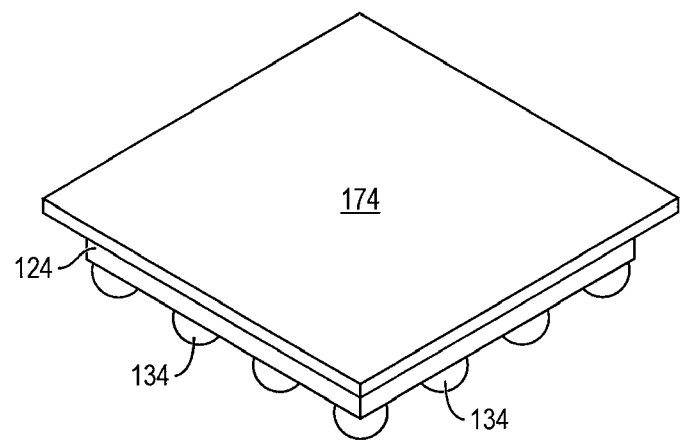
Figure 4W:
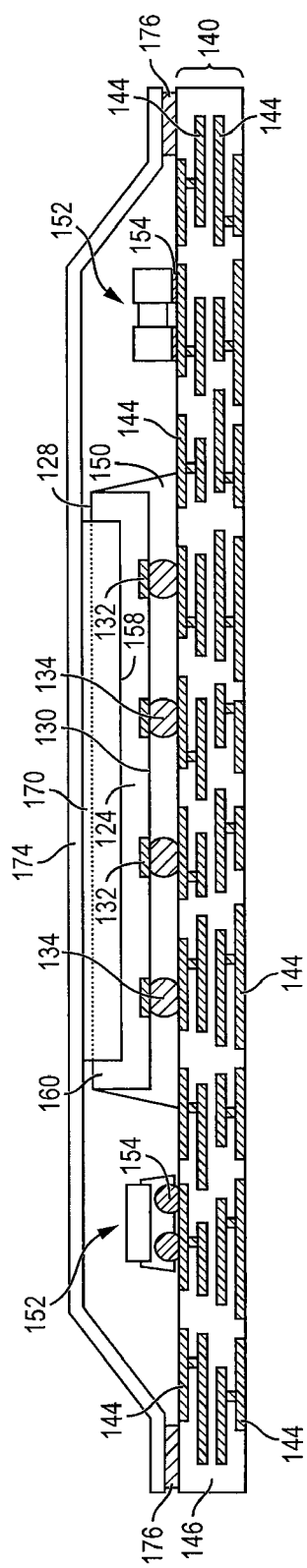
Figure 4X:
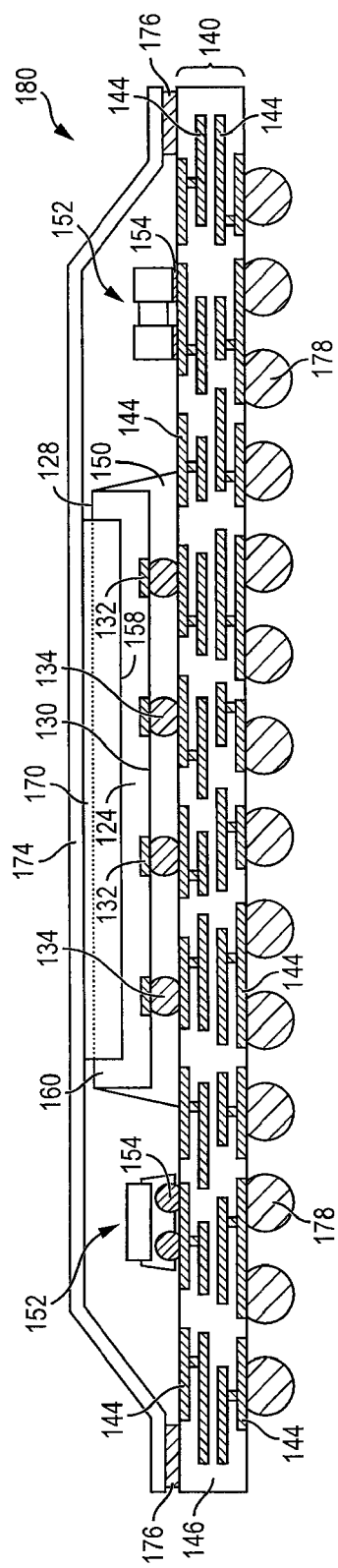

FIGS. 4a-4x illustrate, in relation to FIGS. 1 and 2a-2c, a process of reinforcing thermal performance in a semiconductor die.

In FIG. 4a, a preformed substrate or PCB 140 with contact pads 142 provides a general substrate for structural support and electrical interconnect for semiconductor packages later mounted on the substrate. Conductive signal traces 144 are formed over a surface or within layers of substrate 140 using evaporation, electrolytic plating, electroless plating, screen printing, or other suitable metal deposition process. Signal traces 144 can be one or more layers of Al, Cu, Sn, Ni, Au, Ag, or other suitable electrically conductive material. Signal traces 144 provide for electrical communication between each of the later mounted semiconductor packages, mounted components, and other external system components. A portion of signal traces 144 operates as contact pads 142. Signal traces 144 also provide power and ground connections to each of the semiconductor packages according to the design and function of semiconductor die 124.

Substrate 140 further includes an insulation or passivation layer 146 formed around signal traces 144 for electrical isolation. The insulation layer 146 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulation layer 146 is formed using PVD, CVD, printing, spin coating, spray coating, sintering or thermal oxidation. A plurality of alternating signal traces 144 and insulation layers 146 can be formed one over the other according to the design and electrical function of substrate 140.

In FIG. 4b, semiconductor die 124 from FIGS. 3a-3c is mounted over, and bonded to, substrate 140 using a pick and place operation with active surface 130 oriented toward the substrate. Fiducial alignment marks 148 are formed on substrate 140 to assist alignment, e.g., around an edge of the substrate or around a die location. Bumps 134 are metallurgically and electrically connected to contact pads 142.

In FIG. 4c, an underfill material 150 is deposited under semiconductor die 124. Underfill materials include epoxy, epoxy-resin adhesive material, polymeric materials, films, or other non-conductive materials. Underfill 150 is formed around bumps 134, and fills an area between active surface 130 of semiconductor die 124 and substrate 140. Underfill 150 also contacts a sidewall of semiconductor die 124, and strengthens a connection between semiconductor die 124 and substrate 140. Underfill 150 also includes a mold underfill (MUF). MUF can be pumped from a reservoir to a dispensing needle. MUF is injected under pressure from the dispensing needle between semiconductor die 124 and substrate 140 and around bumps 134. A vacuum assist can draw the MUF to aid with uniform distribution. MUF includes polymer composite material, such as epoxy resin with filler, epoxy acrylate with filler, or polymer with proper filler. MUF is non-conductive and environmentally protects the semiconductor device from external elements and contaminants.

FIG. 4c also shows an IPD or discrete semiconductor component 152 mounted over, and bonded to, substrate 140, with contacts 154 metallurgically and electrically connected to signal traces 144. IPD 152 includes various passive devices such as capacitors, resistors, and inductors that are disposed over a surface of substrate 140.

In FIG. 4d, a laser or saw cutting tool 156 is used to remove a portion of base substrate material 122 from semiconductor die 124 to form recess or cavity 158. Laser 156 includes an ultra-violet (UV) laser emitting light with a wavelength of about 400-100 nanometers (nm), a green laser emitting light with a wavelength of about 500 nm, and a neodymium-doped yttrium aluminum garnet (Nd:YAG) laser emitting light with a wavelength of about 1064 nm. Recess 158 extends from back surface 128 of semiconductor die 124 partially but not completely through the semiconductor die. Recess 158 is formed in a marking process after depositing underfill 150. Recess 158 is formed within a central portion of back surface 128 such that a peripheral portion 160 of back surface 128 remains in a perimeter of recess 158. Peripheral portion 160 is offset with respect to a depth of recess 158. Recess 158 is configured to reduce pump out of a later deposited TIM under cyclic loading due to frequent power on/off cycling. Under cyclic loading, extensive thermo-mechanical stresses are exerted at an interface of a TIM and a die contact area between a back surface of a die and a surface of a heat spreader. The thermo-mechanical stresses exerted at the interface due to the relative motion or flexure between the semiconductor die and the heat-sink lead to a loss of the TIM at the interface. Peripheral portion 160 provides a barrier to the lateral movement or pump out of the TIM while subjected to the thermo-mechanical stresses resulting from frequent power on/off cycling. Recess 158 also provides improved thermal performance with a low bond line thickness because recess 158 contains a portion of the TIM, reducing a thickness of the TIM disposed above back surface 128 of semiconductor die 124. In one embodiment, semiconductor die 124 has dimensions of 10 millimeters (mm) wide×10 mm long×0.77 mm thick and recess 158 includes a square cavity with a depth of approximately 10-200 micrometers (μm). In another embodiment, recess 158 includes a depth of 100 μm.

FIGS. 4e-4j show in greater detail the formation of recess 158 as a square cavity. FIG. 4e shows a plan or top view of back surface 128 prior to the formation of recess 158.

FIG. 4f shows a profile or side view of a cross section taken along line 4f-4f of semiconductor die 124, as shown in FIG. 4e. FIG. 4f further shows back surface 128 and active surface 130 prior to the formation of recess 158.

FIG. 4g shows a plan or top view with laser path 162 winding in a serpentine pattern across back surface 128. Laser path 162 alternatively passes from a first side of back surface 128 to a second side of the back surface with a distance between alternating passes determined by a width of material removed by laser 156. As laser 156 follows laser path 162, recess 158 is formed as a square cavity in semiconductor die 124. The number of times laser path 162 crosses back surface 128 varies with an area of back surface 128 and with a width of material removed by laser 156. When back surface 128 has a larger area, laser path 162 will cross back surface 128 more times than when the back surface has a smaller area. Similarly, when laser 156 removes a larger width of material, laser path 162 will cross back surface 128 fewer times than when laser 156 removes a smaller width of material.

FIG. 4h shows a profile or side view of a cross section taken along line 4h-4h of semiconductor die 124, as shown in FIG. 4g. FIG. 4h shows peripheral portion 160, and recess 158 extending from back surface 128 partially but not completely through semiconductor die 124. As shown in FIG. 4h, recess 158 is not completely formed and extends partially but not completely between opposing peripheral portions 160.

FIG. 4i shows a plan or top view of completed recess 158 as a square cavity in semiconductor die 124, with peripheral portion 160 surrounding a perimeter of recess 158.

FIG. 4j shows a profile or side view of a cross section taken along line 4j-4j of semiconductor die 124, as shown in FIG. 4i. FIG. 4j shows recess 158 extending from back surface 128 partially but not completely through semiconductor die 124, and peripheral portion 160 surrounding a perimeter of recess 158 and extending along sidewalls of semiconductor die 124.

FIG. 4k shows a perspective view of semiconductor die 124 previously shown in plan and profile views in FIGS. 4e-4j, the perspective view including recess 158, peripheral portion 160, and bumps 134.

In another embodiment, FIG. 4l shows a plan or top view of semiconductor die 124 with recesses or cavities 164 formed in back surface 128. Recesses 164 are rectangular channels or trenches at back surface 128, and are formed substantially parallel with respect to a sidewall of semiconductor die 124 and with respect to each other. Recesses 164 are surrounded by peripheral portion 160 and thus do not extend to the sidewall of semiconductor die 124. Fins or strips 165 of base substrate material 122 remain between recesses 164 and extend between opposing sides of peripheral portion 160. A height of fins 165 is determined by a depth of recesses 164. In one configuration, recesses 164 have a depth between approximately 10 and 200 μm. Recesses 164 have a width to height ratio that varies according to the design and function of semiconductor die 124.

FIG. 4m shows a profile or side view of a cross section taken along line 4m-4m of semiconductor die 124 as shown in FIG. 4l. FIG. 4m includes peripheral portion 160 and recesses 164a configured as rectangular channels with a triangular cross section. Recesses 164a have a width that is substantially fixed across back surface 128. The width of recesses 164a decreases as it extends from back surface 128 toward active surface 130, converging to a single point.

FIG. 4n shows another embodiment of a profile or side view of a cross section of semiconductor die 124 similar to FIG. 4m. FIG. 4n includes peripheral portion 160, and recesses 164b configured as rectangular channels with square or rectangular cross sections. Recesses 164b have a width that is substantially fixed across back surface 128, the width also being substantially fixed from back surface 128 extending toward active surface 130.

FIG. 4o shows a perspective view of the configuration previously shown in FIG. 4l, including recesses 164 and fins 165. Recesses 164 are rectangular channels or trenches at back surface 128, and are formed substantially parallel with respect to a sidewall of semiconductor die 124 and with respect to each other. Recesses 164 have a triangular cross section as shown in FIG. 4m or a square or rectangular cross sections as shown in FIG. 4n. Recesses 164 are surrounded by peripheral portion 160 and thus do not extend to the sidewall of semiconductor die 124. Between recesses 164, fins or strips 165 of base substrate material 122 remain, extending between opposing sides of peripheral portion 160. A height of fins 165 is determined by a depth of recesses 164. In one embodiment, recesses 164 have a depth between approximately 10 and 200 μm. Furthermore, recesses 164 are configured to reduce pump out of a later deposited TIM. Peripheral portion 160 provides a barrier to the lateral movement or pump out of the TIM while subjected to the thermo-mechanical stresses resulting from frequent power on/off cycling of semiconductor die 124. Recesses 164 also provide improved thermal performance with a low bond line thickness because recesses 164 contain a portion of the TIM, reducing a thickness of the TIM disposed above back surface 128 of semiconductor die 124.

In another embodiment, FIG. 4p shows a plan or top view of semiconductor die 124 with recesses or cavities 166 and 167 formed in back surface 128. Recesses 166 and 167 are rectangular channels or trenches formed in semiconductor die 124 and surrounded by peripheral portion 160. Recesses 166 are substantially parallel with respect to a first sidewall of semiconductor die 124 and with respect to each other, and are surrounded by peripheral portion 160 such that the recesses do not extend to the sidewall of semiconductor die 124. Similarly, recesses 167 are substantially parallel with respect to a second sidewall of semiconductor die 124 and with respect to each other, and are surrounded by peripheral portion 160 such that the recesses do not extend to the sidewall of semiconductor die 124. Recesses 166 are oriented perpendicularly with respect to recesses 167. Between orthogonally intersecting recesses 166 and 167, remaining interior portions 168 of base substrate material 122 remain as islands in relief between recesses 166 and 167. A top surface of interior portions 168 is substantially coplanar with back surface 128. A height of interior portions 168 is determined by a depth of recesses 166 and 167. In one configuration, recesses 166 and 167 have a depth between approximately 10 and 200 µm.

FIG. 4q shows a profile or side view of a cross section taken along line 4q-4q of semiconductor die 124 as shown in FIG. 4p. FIG. 4q includes peripheral portion 160, and recesses 166a configured as rectangular channels with a triangular cross section. Recesses 166a have a width that is substantially fixed across back surface 128. The width of recess 166a decreases as it extends from back surface 128 toward active surface 130, the width of the opening converging to a single point.

FIG. 4r shows a profile or side view of a cross section of semiconductor die 124 similar to FIG. 4q. FIG. 4r includes peripheral portion 160, and recesses 166b configured as rectangular channels with a rectangular cross section. Recesses 166b have a width that is substantially fixed across back surface 128, and substantially fixed from back surface 128 extending toward active surface 130.

FIG. 4s shows a perspective view of the configuration previously shown in FIG. 4p, including recesses 166, recesses 167, and interior portions 168. Recesses 166 are substantially parallel with respect to a first sidewall of semiconductor die 124 and with respect to each other. Similarly, recesses 167 are substantially parallel with respect to a second sidewall of semiconductor die 124 and with respect to each other. Recesses 166 and 167 are surrounded by peripheral portion 160 such that the recesses do not extend to the sidewalls of semiconductor die 124. Recesses 166 are oriented perpendicularly with respect to recesses 167. Between orthogonally intersecting recesses 166 and 167, interior portions 168 of base substrate material 122 remain as islands in relief between recesses 166 and 167. A top surface of interior portions 168 is substantially coplanar with back surface 128, and recesses 166 and 167 create a void in back surface 128 surrounding interior portions 168. Together, recesses 166, 167, and interior portions 168 create a patterned surface that is discontinuous or intermittent with respect to back surface 128 before the formation of recesses 166 and 167. A height of interior portions 168 is determined by a depth of recesses 166 and 167. In one configuration, recesses 166 and 167 have a depth between approximately 10 and 200 µm. Furthermore, recesses 166 and 167 are configured to reduce pump out of a later deposited TIM. Peripheral portion 160 provides a barrier to the lateral movement or pump out of the TIM while subjected to the thermo-mechanical stresses resulting from frequent power on/off cycling of semiconductor die 124. Recesses 166 and 167 also provide improved thermal performance with a low bond line thickness because recesses 166 and 167 contain a portion of the TIM, reducing a thickness of the TIM disposed above back surface 128.

In FIG. 4t, TIM 170 is disposed over semiconductor die 124 and within recess 158. TIM 170 can be thermal epoxy, thermal epoxy resin, thermal conductive paste, aluminum oxide, zinc oxide, boron nitride, pulverized silver, or thermal grease. By disposing TIM 170 within recess 158, an increased surface area of semiconductor die 124 contacts TIM 170 to aid with distribution and dissipation of heat generated by the semiconductor die. Furthermore, peripheral portion 160 together with recess 158 restricts the movement of TIM 170 away from an interface between semiconductor die 124 and a later mounted heat spreader, thereby reducing the pump out of the TIM during the operation of semiconductor die 124. Recess 158 also provides improved thermal performance while maintaining a low bond line thickness by containing a portion of TIM 170 recessed between back surface 128 and active surface 130.

FIG. 4u shows a perspective view of semiconductor die 124 similar to FIG. 4k. TIM 170 is disposed over semiconductor die 124 and within recess 158.

FIG. 4v shows a perspective view of semiconductor die 124 similar to FIG. 4u, and further shows a portion of a heat spreader 174 mounted over semiconductor die 124 and mechanically and thermally connected to TIM 170. Heat spreader 174 can be Cu, Al, or other material with high thermal conductivity. Heat spreader 174, together with TIM 170, forms a thermally conductive path that aids with distribution and dissipation of heat generated by semiconductor die 124, thereby increasing thermal performance of the semiconductor die.

FIG. 4w shows a profile of semiconductor die 124 and IPDs 152 mounted to substrate 140. Heat spreader 174 is mounted over substrate 140, IPDs 152, and semiconductor die 124. As previously discussed in relation to FIG. 4v, heat spreader 174 is mechanically and thermally connected to TIM 170 and is part of a thermally conductive path that aids with the distribution and dissipation of heat generated by semiconductor die 124. Heat spreader 174 is connected to substrate 140 with conductive material 176. Conductive material 176 is formed over substrate 140 and is electrically and mechanically connected to portions of conductive signal traces 144 according to the design and function of substrate 140 and semiconductor die 124. Conductive material 176 includes Al, Cu, Sn, Ni, Au, or Ag, and is formed by PVD, CVD, electrolytic plating, or electroless plating process.

In FIG. 4x, an electrically conductive bump material is deposited over substrate 140 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate 140 using a suitable attachment or bonding process. In one embodiment, the bump material is reflowed by heating the material above its melting point to form spherical balls or bumps 178. In some applications, bumps 178 are reflowed a second time to improve electrical contact to substrate 140. Bumps 178 represent one type of interconnect structure that can be formed over substrate 140. The interconnect structure can also use stud bump, micro bump, or other electrical interconnect. Bumps 178 are configured to electrically and mechanically connect to semiconductor devices external to thermally reinforced semiconductor device 180.

Accordingly, the thermally reinforced semiconductor device 180 includes semiconductor die 124 mounted to substrate 140 with bumps 134 and underfill 150. A portion of base substrate material 122 is removed from semiconductor die 124 to form recess 158. In one embodiment, recess 158 is formed with a green laser. Recess 158 extends from back surface 128 of semiconductor die 124 partially but not completely through the semiconductor die. Recess 158 is formed in a marking process after depositing underfill 150. Recess 158 is formed within a central portion of back surface 128 such that a peripheral portion 160 of back surface 128 remains in a perimeter of recess 158. Recess 158 is configured to reduce pump out of TIM 170 under cyclic loading due to frequent power on/off cycling. In another embodiment, the recess extending from back surface 128 partially but not completely through the semiconductor die 124 includes a plurality of rectangular channels or trenches formed substantially parallel to a sidewall of semiconductor die 124 and to each other. Fins or strips 165 of base substrate material 122 remain between recesses 164. Recesses 164 have a rectangular, square, triangular, or other suitable cross sectional shape. In yet another embodiment, the recesses extending from back surface 128 partially but not completely through the semiconductor die 124 include recesses 166 and 167, which are substantially parallel to sidewalls of semiconductor die 124. Recesses 166 are oriented perpendicularly with respect to recesses 167. Between orthogonally intersecting recesses 166 and 167, interior portions 168 of base substrate material 122 remain in relief between recesses 166 and 167.

Under cyclic loading, extensive thermo-mechanical stresses are exerted at an interface of TIM 170 and a die contact area between a back surface of semiconductor die 124 and a surface of a heat spreader 174. Peripheral portion 160 provides a barrier to the lateral movement or pump out of TIM 170 while subjected to the thermo-mechanical stresses resulting from frequent power on/off cycling of semiconductor die 124. Recesses 158, 164, or 166 and 167 also provide improved thermal performance with a low bond line thickness because the recesses contain a portion of TIM 170, reducing a thickness of the TIM disposed above back surface 128 of semiconductor die 124.

Figure 5A:
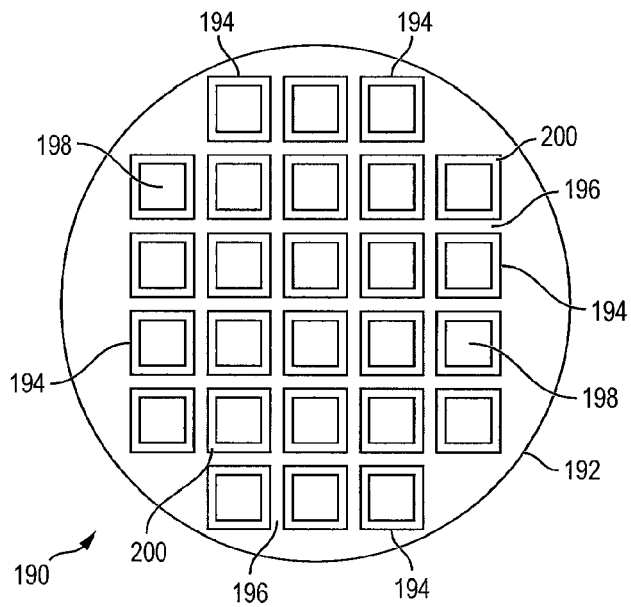
FIGS. 5a-5c illustrate a semiconductor wafer with a plurality of semiconductor die including recesses separated by saw streets.

In another embodiment, FIG. 5a shows a semiconductor wafer 190 with a base substrate material 192, such as silicon, germanium, gallium arsenide, indium phosphide, or silicon carbide, for structural support. A plurality of semiconductor die or components 194 is formed on semiconductor wafer 190 separated by saw streets 196, as described above.

Each semiconductor die 194 has a recess or cavity 198 formed by a laser or saw cutting tool removing a portion of base substrate material 192 from a central interior portion of semiconductor die 194. Recesses 198 extend partially but not completely through semiconductor die 194, and extend partially but not completely across a surface of semiconductor die 194 between saw streets 196. In one embodiment, recess 198 is formed as a square cavity by a green laser in a process similar to the process described in FIGS. 4e-4j. Alternatively, recesses 198 further include rectangular channels or trenches with triangular, square, or rectangular cross sections. Recesses 198 are formed substantially parallel with respect to a sidewall of semiconductor die 194 and substantially parallel with respect to each other in a process similar to the process described in FIGS. 4l-4o. Recesses 198 further include rectangular channels or trenches with triangular, square, or rectangular cross sections formed perpendicular with respect to each other in a process similar to a process described in FIGS. 4p-4s. With recesses 198 configured perpendicularly with respect to each another, remaining interior portions of base substrate material 192 remain as islands in relief between recesses 198. With each configuration of recesses 198, the recesses are configured to reduce pump out of a later deposited TIM under cyclic loading due to frequent power on/off cycling of semiconductor die 194. Recesses 198 also provide improved thermal performance by increasing a surface area of semiconductor die 194 that will contact the later deposited TIM, and provide a low bond line thickness by containing a portion of the TIM, thereby reducing a thickness of the TIM disposed over a back surface of semiconductor die 194.

Peripheral portion 200 includes a portion of base substrate material 192 that remains after recess 198 is formed. Peripheral portion 200 surrounds a perimeter of recess 198 and extends along sidewalls of semiconductor die 194 to provide a barrier to the lateral movement or pump out of a later deposited TIM. Peripheral portion 200 is vertically offset with respect to recess 198.

Figure 5B:
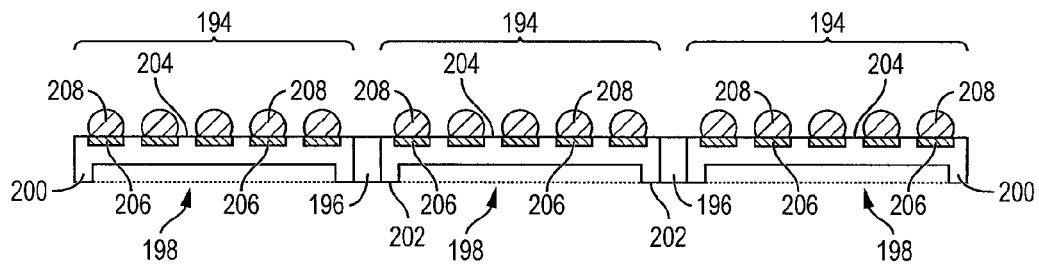

FIG. 5b shows a cross-sectional view of a portion of semiconductor wafer 190. Each semiconductor die 194 has a back surface 202 with recess 198 extending from back surface 202 partially but not completely through semiconductor die 194. Peripheral portion 200 surrounds a perimeter of recess 198 and extends along sidewalls of semiconductor die 194. Each semiconductor die 194 has an active surface 204 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 204 to implement analog circuits or digital circuits, such as DSP, ASIC, memory, or other signal processing circuit. Semiconductor die 194 may also contain IPDs, such as inductors, capacitors, and resistors, for RF signal processing.

An electrically conductive layer 206 is formed over active surface 204 using PVD, CVD, electrolytic plating, electroless plating process, or other suitable metal deposition process. Conductive layer 206 can be one or more layers of Al, Cu, Sn, Ni, Au, Ag, or other suitable electrically conductive material. Conductive layer 206 operates as contact pads electrically connected to the circuits on active surface 204.

An electrically conductive bump material is deposited over conductive layer 206 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 206 using a suitable attachment or bonding process. In one embodiment, the bump material is reflowed by heating the material above its melting point to form spherical balls or bumps 208. In some applications, bumps 208 are reflowed a second time to improve electrical contact to conductive layer 206. In one embodiment, bumps 208 are formed over a UBM having a wetting layer, barrier layer, and adhesive layer. The bumps can also be compression bonded to conductive layer 206. Bumps 208 represent one type of interconnect structure that can be formed over conductive layer 206. The interconnect structure can also use bond wires, conductive paste, stud bump, micro bump, or other electrical interconnect. In one embodiment, semiconductor die 194 is a flipchip type semiconductor die.

Figure 5C:
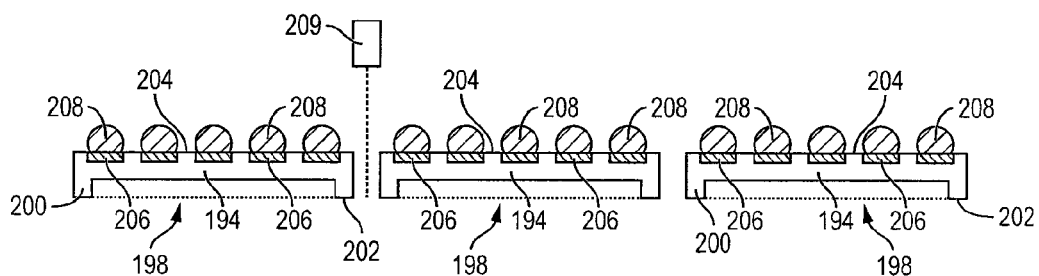

In FIG. 5c, semiconductor wafer 190 is singulated through saw street 196 using saw blade or laser cutting tool 209 into individual semiconductor die 194. Each semiconductor die 194 has bumps 208 formed over contact pads 206.

Figure 6D:
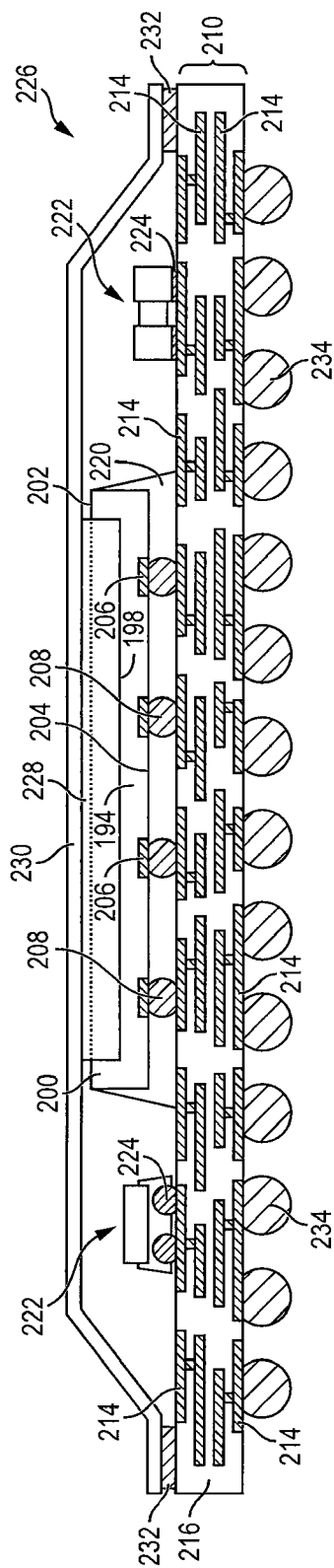

FIGS. 6a-6d illustrate, in relation to FIGS. 1 and 2a-2c, a process of reinforcing thermal performance in a semiconductor die. In FIG. 6a, a preformed substrate or PCB 210 with contact pads 212 provides a general substrate for structural support and electrical interconnect for semiconductor packages later mounted on the substrate. Conductive signal traces 214 are formed over a surface or within layers of substrate 210 using evaporation, electrolytic plating, electroless plating, screen printing, or other suitable metal deposition process. Signal traces 214 can be one or more layers of Al, Cu, Sn, Ni, Au, Ag, or other suitable electrically conductive material. Signal traces 214 provide for electrical communication between each of the later mounted semiconductor packages, mounted components, and other external system components. A portion of signal traces 214 operates as contact pads 212. Signal traces 214 also provide power and ground connections to each of the semiconductor packages according to the design and function of the semiconductor packages.

Substrate 210 further includes an insulation or passivation layer 216 formed around signal traces 214 for electrical isolation. The insulation layer 216 contains one or more layers of SiO2, Si3N4, SiON, Ta2O5, Al2O3, or other material having similar insulating and structural properties. The insulation layer 216 is formed using PVD, CVD, printing, spin coating, spray coating, sintering or thermal oxidation. A plurality of alternating signal traces 214 and insulation layers 216 can be formed one over the other according to the design and electrical function of substrate 210.

In FIG. 6b, semiconductor die 194 from FIGS. 5a-5c is mounted over, and bonded to, substrate 210 using a pick and place operation with active surface 204 oriented toward the substrate. Fiducial alignment marks 218 are formed on substrate 210 to assist alignment, e.g., around an edge of the substrate or around a die location. Bumps 208 are metallurgically and electrically connected to contact pads 212. When semiconductor die 194 is mounted to substrate 210, recesses 198 have already been formed. Recesses 198 are formed at the wafer level as shown in FIG. 5a, or alternatively, the recesses are formed after semiconductor die 194 are singulated but before the semiconductor die are mounted to substrate 210.

In FIG. 6c, an underfill material 220 is deposited under semiconductor die 194. Underfill materials include epoxy, epoxy-resin adhesive material, polymeric materials, films, or other non-conductive materials. Underfill 220 is formed around bumps 208, and fills an area between active surface 204 of semiconductor die 194 and substrate 210. Underfill 220 also contacts a sidewall of semiconductor die 194, and strengthens a connection between semiconductor die 194 and substrate 210. Underfill 220 also includes a MUF. MUF can be pumped from a reservoir to a dispensing needle. MUF is injected under pressure from the dispensing needle between semiconductor die 194 and substrate 210 and around bumps 208. A vacuum assist can draw the MUF to aid with uniform distribution. MUF includes polymer composite material, such as epoxy resin with filler, epoxy acrylate with filler, or polymer with proper filler. MUF is non-conductive and environmentally protects the semiconductor device from external elements and contaminants.

FIG. 6c also shows an IPD or discrete semiconductor component 222 mounted over, and bonded to, substrate 210, with contacts 224 metallurgically and electrically connected to signal trace 214. IPDs 222 include various passive devices such as capacitors, resistors, and inductors that are disposed over a surface of substrate 210.

FIG. 6d shows a complete thermally reinforced semiconductor device 226. Thermally reinforced semiconductor device 226 is completed by a process similar to the process shown in FIGS. 4t-4x. TIM 228 is disposed over semiconductor die 194 and within recess 198. TIM 228 can be thermal epoxy, thermal epoxy resin, thermal conductive paste, aluminum oxide, zinc oxide, boron nitride, pulverized silver, or thermal grease. By disposing TIM 228 within recess 198, an increased surface area of semiconductor die 194 contacts TIM 228 to aid with distribution and dissipation of heat generated by the semiconductor die. Furthermore, peripheral portion 200 and recess 198 restrict the movement of TIM 228 away from an interface between semiconductor die 194 and a later mounted heat spreader, thereby reducing the pump out of the TIM during the operation of semiconductor die 194. Recess 198 also provides improved thermal performance while maintaining a low bond line thickness by containing a portion of TIM 228 recessed between back surface 202 and active surface 204.

In FIG. 6d, heat spreader 230 is mounted over substrate 210, IPDs 222, and semiconductor die 194. Heat spreader 230 is mechanically and thermally connected to TIM 228 and is part of a thermally conductive path that aids with the distribution and dissipation of heat generated by semiconductor die 194. Heat spreader 230 is connected to substrate 210 with conductive material 232. Conductive material 232 is formed over substrate 210 and is electrically and mechanically connected to portions of conductive signal traces 214 according to the design and function of substrate 210 and semiconductor die 194. Conductive material 232 includes Al, Cu, Sn, Ni, Au, or Ag, and is formed by PVD, CVD, electrolytic plating, or electroless plating process.

FIG. 6d further shows an electrically conductive bump material deposited over substrate 210 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate 210 using a suitable attachment or bonding process. In one embodiment, the bump material is reflowed by heating the material above its melting point to form spherical balls or bumps 234. In some applications, bumps 234 are reflowed a second time to improve electrical contact to substrate 210. Bumps 234 represent one type of interconnect structure that can be formed over substrate 210. The interconnect structure can also use stud bump, micro bump, or other electrical interconnect. Bumps 234 are configured to electrically and mechanically connect to semiconductor devices external to thermally reinforced semiconductor device 226.

Figure 7:
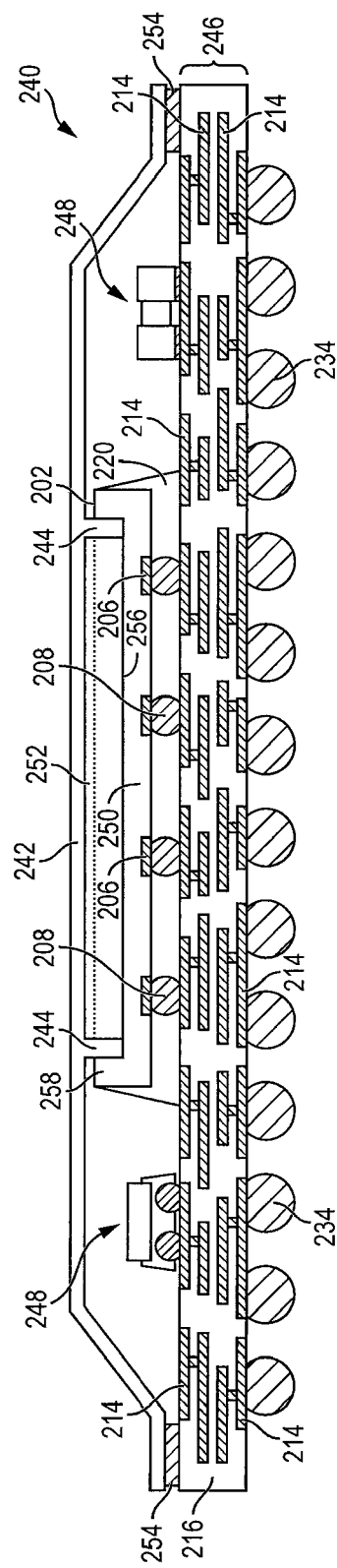
FIG. 7 illustrates an embodiment of a thermally reinforced semiconductor device including protrusions extending into a recess.

FIG. 7 shows thermally reinforced semiconductor device 240 that is formed by a process similar to the processes shown in FIGS. 4a-4x and FIGS. 6a-6d. However, heat spreader 242 differs from heat spreaders 174 and 230 because of the inclusion of protrusions 244. Heat spreader 242 is mounted over substrate 246, IPDs 248, and semiconductor die 250. Heat spreader 242 is mechanically and thermally connected to TIM 252 and is part of a thermally conductive path that aids with the distribution and dissipation of heat generated by semiconductor die 250. Heat spreader 242 is connected to substrate 246 with conductive material 254. Conductive material 254 is formed over and is electrically and mechanically connected to substrate 246.

Protrusions 244 are integral pieces of heat spreader 242 that extend perpendicularly away from a planar surface of the heat spreader. Alternatively, protrusions 244 are discrete elements mechanically and thermally connected to heat spreader 242. In both cases, protrusions 244 can be Cu, Al, or other material with high thermal conductivity and form part of the thermally conductive path that aids with the distribution and dissipation of heat generated by semiconductor die 250. Protrusions 244 extend from a planar surface of heat spreader 242 formed over semiconductor die 250 and extend into recess 256. Protrusions 244 further extend along a sidewall of peripheral portion 258 forming an enclosure with respect to TIM 252. When recess 256 includes a square cavity, protrusions 244 are configured to extend along four sides of recess 256 to form a perimeter and provide a barrier to the lateral movement of TIM 252. In one configuration, protrusions 244 directly contact semiconductor die 250 including peripheral portion 258. Protrusions 244 together with peripheral portion 258 restrict movement of TIM 252 from an interface between semiconductor die 250 and heat spreader 242, thereby reducing pump out of the TIM during operation of semiconductor die 250.

Figure 8:
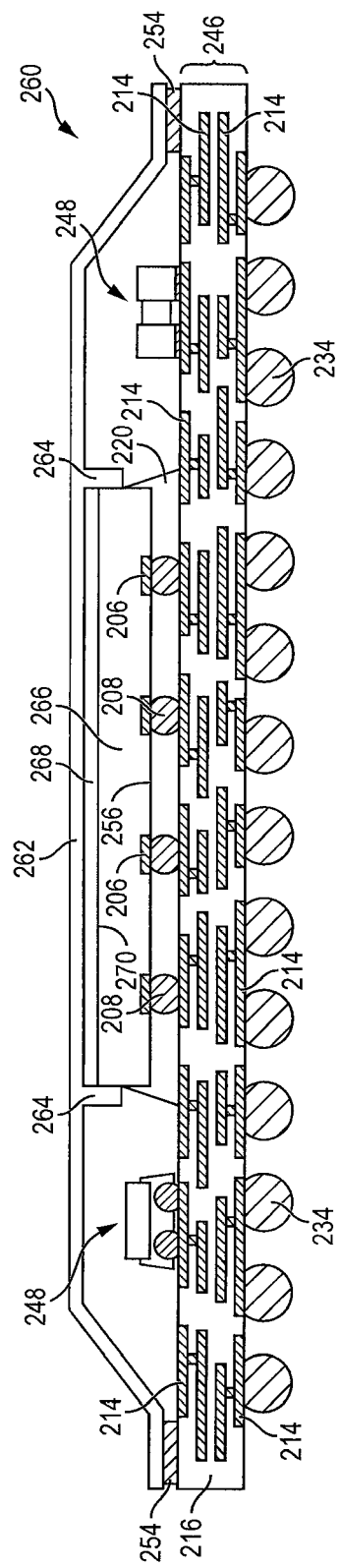
FIG. 8 illustrates an embodiment of a thermally reinforced semiconductor device including protrusions extending along a sidewall of a semiconductor die.

FIG. 8 shows thermally reinforced semiconductor device 260 similar to thermally reinforced semiconductor device 240 in FIG. 7. However, heat spreader 262 differs from heat spreader 242 with respect to a positioning of protrusions 264. Protrusions 264 are integral pieces of heat spreader 262 that extend perpendicular away from a planar surface of the heat spreader. Alternatively, protrusions 264 can be discrete elements mechanically and thermally connected to heat spreader 262. In both cases, protrusions 264 can be Cu, Al, or other material with high thermal conductivity and form part of the thermally conductive path that aids with the distribution and dissipation of heat generated by semiconductor die 266. Protrusions 264 extend from a planar surface of heat spreader 262 formed over semiconductor die 266 to a side wall of semiconductor die 266 and adjacent to TIM 268. TIM 268 is disposed over a back surface 270 of semiconductor die 266 and can also be disposed within a cavity or recess formed partially but not completely through the semiconductor die as discussed above. Protrusions 264 extend along and directly contact a sidewall of semiconductor die 266 to form an enclosure with respect to TIM 268. In one embodiment, protrusions 264 are configured in a square pattern and extend along four sides of semiconductor die 266 to form a perimeter and provide a barrier to the lateral movement of TIM 268. Protrusions 264 restrict movement of TIM 268 away from an interface between semiconductor die 266 and heat spreader 262, thereby reducing pump out of TIM 268 during operation of semiconductor die 266.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
a semiconductor die disposed over the substrate with an active surface of the semiconductor die oriented toward the substrate;
a thermal interface material (TIM) deposited over a backside of the semiconductor die opposite the active surface including a portion of the TIM disposed between the active surface and backside of the semiconductor die with a portion of the backside of the semiconductor die devoid of the TIM; and
a heat spreader disposed over the semiconductor die, contacting the TIM, and connected to the substrate with a peripheral portion of the semiconductor die restricting movement of the TIM from an interface between the semiconductor die and heat spreader.

2. The semiconductor device of claim 1, further including protrusions that extend from the heat spreader and over a side portion of the TIM.

3. The semiconductor device of claim 1, further including a recess formed in an interior portion of the semiconductor die.

4. The semiconductor device of claim 3, wherein the recess includes a square, rectangular, or triangular cross section.

5. A semiconductor device, comprising:
a substrate;
a semiconductor die disposed with a first surface oriented toward the substrate and a recess formed in an interior portion of the semiconductor die extending from a second surface of the semiconductor die opposite the first surface partially through the semiconductor die;
a thermal interface material (TIM) deposited over the semiconductor die and into the recess such that the TIM in the recess is surrounded by a peripheral portion of the semiconductor die to reduce flow of the TIM away from the semiconductor die; and
a heat spreader disposed over the semiconductor die, contacting the TIM, and connected to the substrate with a region between the second surface of the semiconductor die and the heat spreader being devoid of the TIM.

6. The semiconductor device of claim 5, wherein protrusions extend from the heat spreader to within the recess and surrounding a perimeter of the TIM to reduce flow of the TIM away from the semiconductor die.

7. The semiconductor device of claim 5, wherein protrusions extend from the heat spreader to contact a sidewall of the semiconductor die outside the recess and surrounding a perimeter of the TIM to reduce flow of the TIM away from the semiconductor die.

8. The semiconductor device of claim 5, wherein the TIM includes thermal grease.

9. The semiconductor device of claim 5, wherein the recess in the interior portion of the semiconductor die includes a square, rectangular, or triangular cross section.

10. A semiconductor device, comprising:
a substrate;
a semiconductor die disposed over the substrate including a first surface oriented toward the substrate;
a thermal interface material (TIM) deposited over a second surface of the semiconductor die opposite the first surface and into a recess of the semiconductor die; and
a heat spreader disposed over the semiconductor die, contacting the TIM, and connected to the substrate with a peripheral portion of the semiconductor die and the recess restricting movement of the TIM from an interface between the second surface of the semiconductor die and heat spreader.

11. The semiconductor device of claim 10, further including a plurality of recesses formed over the second surface of the semiconductor die as rectangular channels or trenches substantially parallel with respect to a sidewall of the semiconductor die and with respect to each other.

12. The semiconductor device of claim 10, further including an interconnect structure formed in the substrate.

13. The semiconductor device of claim 10, wherein the TIM includes thermal grease.

14. The semiconductor device of claim 10, wherein the recess includes a square, rectangular, or triangular cross section.

15. A semiconductor device, comprising:
a semiconductor die;
a thermal interface material (TIM) deposited into a recess of the semiconductor die; and
a heat spreader disposed over the semiconductor die contacting the TIM with the recess restricting movement of the TIM from an interface between the semiconductor die and heat spreader.

16. The semiconductor device of claim 15, further including a passive device disposed adjacent to the semiconductor die.

17. The semiconductor device of claim 15, further including a substrate connected to the heat spreader.

18. The semiconductor device of claim 15, wherein the recess includes a square, rectangular, or triangular cross section.

19. The semiconductor device of claim 15, further including protrusions extending from the heat spreader and over the recess of the semiconductor die.

* * * * *